Nov. 12, 1968 R. WIESNER 3,411,053

VOLTAGE-SENSITIVE VARIABLE P-N JUNCTION CAPACITOR WITH INTERMEDIATE CONTROL ZONE

Filed April 5, 1966

United States Patent Office 3,411,053
Patented Nov. 12, 1968

3,411,053

VOLTAGE-SENSITIVE VARIABLE P-N JUNCTION CAPACITOR WITH INTERMEDIATE CONTROL ZONE

Richard Wiesner, Munich, Germany, assignor to Siemens Aktiengesellschaft, Munich, Germany, a corporation of Germany

Filed Apr. 5, 1966, Ser. No. 540,321
Claims priority, application Germany, Apr. 7, 1965, S 96,402
9 Claims. (Cl. 317—235)

ABSTRACT OF THE DISCLOSURE

A semiconductor body of one conductivity type has at least two zones of the other conductivity type mutually spaced beside one another and each forming a respective p-n junction. One zone constitutes one electrode and the body of the other electrode of a voltage-dependent capacitor which includes one of the p-n junctions, an intermediate body portion interconnecting the zones and including a control for controlling the electrical conductivity thereof to selectively electrically connect the other zone to the one zone and in parallel therewith in the p-n junction capacitor in response to selective voltage applied across the control and the body, whereby the capacitance variation range of the capacitor is selectively widenable in response to the control.

Figure 1:
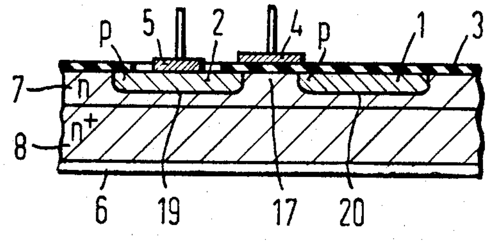

My invention relates to a semiconductor variable capacitor in which the voltage-dependent width of a p-n junction or depletion layer is utilized for varying the effective capacitance.

Such voltage-sensitive capacitors, known as Varactors or Varicaps, are employed, for example, for tuning resonant circuits. Various purposes make it desirable to broaden the range of change in capacitance obtainable with such semiconductor devices. For example, if tuners in video circuits are to be electrically controlled by means of such capacitors, the normally obtainable rise in frequency is too small. By providing for an abrupt p-n junction, a variation in capacitance (C) in dependence upon the voltage (U) can at best attain a value corresponding to the $C \approx U^{-1/2}$-law. Although so-called hypersensitive Varicaps of a wider capacitance range can be produced by providing for special doping profiles, such devices fundamentally exhibit a relatively high path resistance or impedance and thus result in a poor quality factor when used in oscillatory circuits.

It is an object of my invention to devise a semiconductor variable capacitor of the p-n junction type which can be operated with a continuously or incrementally extendable capacitance range so as to afford a much wider capacitance or frequency range than heretofore feasible without apprecialy increasing the path resistance.

To this end, and in accordance with my invention, I provide the semiconductor crystalline body of the variable capacitor device with at least two zones doped for the conductivity type opposite that of the main bulk of the body and being located beside one another in mutually spaced relation. One of these oppositely doped zones is provided with a capacitor electrode opposite the second capacitor electrode which contacts the main portion of the crystalline body, whereby the p-n junction of that one zone forms part of a voltage-responsive capacitor. The device is further provided with control means for varying the conductivity of the intermediate body portion located between the above-mentioned zones in order to switch the other p-n junction or junctions into effective connection with the first-mentioned junction, thereby effecting the desired controlled change in capacitance variation range of the device.

According to the invention, therefore, a voltage-responsive variable capacitance constituted by a first p-n junction is electrically supplemented in the same device by at least one other voltage-responsive capacitance with the aid of a surface channel which is located between the individual p-n junctions arranged one beside the other and which forms between these capacitances a connecting bridge to be opened and closed by controlling the conductivity of the channel. As a result, the variation range of the semiconductor variable capacitor can be widened while preserving a low path resistance.

As a rule, it is desirable that the addition or activation of the supplemental p-n junction capacitances results in an increase in capacitance value. For that reason, and in accordance with another feature of my invention, the oppositely doped zones in the semiconductor body are preferably arranged for electrical parallel connection of the simultaneously effective p-n junctions.

The control of the conductivity of the channel portion located in the semiconductor body between the oppositely doped zones can be effected by any of the methods known in semiconductor techniques. For example, the conductivity of the channel may be controlled by the injection of light quantums, i.e., by subjecting the surface at the particular locality to irradiation by light or other electromagnetic radiation.

However, according to another feature of my invention, it is particularly favorable to effect the control of the conductivity by means of an electrical field. Such a control of the surface channel, and consequently the opening or closing of the channel, may be effected, for example, with the aid of a field electrode corresponding to those employed in field-effect transistors or fieldistors.

According to another, more specific, feature of my invention relating to field control of the additional capacitances, the semiconductor body is coated, at least at the portion located between the zones of opposite conductance type, with an insulating layer which carries a metal layer to serve as the field electrode. Preferably employed as an insulating layer is an oxide coating, such as the oxide of the particular semiconductor material of which the crystalline body consists. Particularly well suitable for this purpose is a coating of silicon dioxide. The resulting layer sequence then corresponds to that of the known metal oxide-semiconductor devices.

Such a device functions as follows. If the semiconductor main body is of p conductivity type, a voltage which is applied between the electrode and the semiconductor body and which is positive relative to the semiconductor body, has the effect that the electrode will drain holes (defect electrons) from the semiconductor surface so that, with a correspondingly high positive bias voltage, there will occur an enrichment or crowding of free electrons at the phase boundary between oxide and semiconductor. That is, the surface channel is then open, and the n conductivity type zones are then conductively connected with each other. However, when a negative direct voltage is applied to the metal of the electrode, the channel is closed so that the adjacent zones are electrically separated from each other. A flow of current between the individual capacitance regions is also prevented at zero bias voltage and at only slight positive bias voltages. Analogously, if the semiconductor main body is of n conductivity type and the above-mentioned zones are of p conductivity type, the polarity of the voltages to be applied is to be reversed.

It is particularly advantageous to produce the above-mentioned capacitance-forming zones by diffusion in accordance with the known planar technique. The dopant diffused into these zones then reverses the original conductivity type to the opposite conductivity type. The planar diffusion technique requires using a mask consisting of an oxide coating with window openings through which the diffusion takes place. This oxide mask simultaneously serves as a protective coating for the p-n junction at the semiconductor surface; and the same oxide coating may be employed as an insulating layer which is to carry the field electrode for controlling the conductivity of the connecting surface channel between the oppositely doped zones.

For obtaining a low series resistance it is further favorable to have the main crystalline body of the device consist of a region having a relatively low specific electrical resistance and an adjacent region of relatively high specific resistance, the oppositely doped zones being located beside each other and in mutually spaced relation within the region having the higher specific resistance. It is particularly advisable to produce the region of relatively high specific resistance upon the region of lower specific resistance by epitaxial deposition in the known manner.

The above-mentioned oppositely doped zones may be located in a row, one behind the other, along the crystalline body, such as a generally rectangular slab of silicon, germanium or other semiconductor material. However, the oppositely doped zones may also be arranged in coaxial relation to each other such as in the form of concentric circles.

Figure 2:
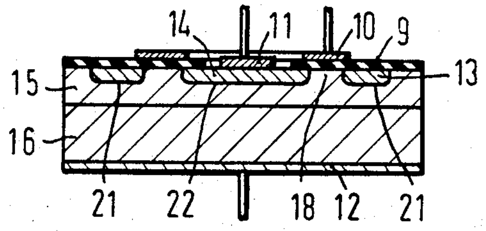

The invention will be further described with reference to embodiments of semiconductor variable capacitors according to the invention illustrated by way of example in the accompanying drawing, in which:

FIG. 1 shows schematically and in section a capacitor device in which the zones of opposite conductivity are arranged in a straight row, only two of them being illustrated; and FIG. 2 shows in section a second embodiment having two capacitance-forming p-n junctions in a coaxial arrangement.

Referring to a device illustrated in FIG. 1, the semiconductor body, for example of silicon of n conductivity type, comprises two regions 7 and 8 of different electrical conductivity, the region 8 having a lower specific resistance than the region 7. Preferably, the region 7 is produced by the epitaxial technique. Embedded in the region 7 of relatively high specific resistance are two zones of p conductivity type denoted by 1 and 2. These zones are produced by diffusion in accordance with the known planar technique. The top and bottom faces of the semiconductor crystalline body are coated with respective layers 3 and 6 of silicon dioxide. The coating 3 is provided with an opening above the oppositely doped zone 2. Within the opening a metal electrode 5 is joined with the zone 2 to form a barrier-free (ohmic) contact therewith. It will be understood that the semiconductor body of n conductivity type is contacted at a suitable location with another electrode. For example, the coating 6 may be replaced fully or in part by such a second capacitor electrode.

When a blocking voltage is applied between the just-mentioned capacitor electrode and the capacitor electrode 5 so as to be effective between the zone 2 of p conductivity type and the main semiconductor body of the device of n conductivity type, the p-n junction 19 or rather the space-charge layer which constitutes this junction, is widened so that the capacitance of the device is dependent upon the magnitude of the voltage applied.

For controlling the conductivity of the semiconductor portion 17 between the two zones 1 and 2 of p conductivity type there is provided a field electrode 4 which is mounted upon the silicon-dioxide coating 3 so as to be electrically insulated from the semiconductor crystalline body. The size of the electrode area is so chosen that it completely covers at least the surface of the semiconductor portion extending between the two zones 1 and 2 of p conductivity type. Depending upon the bias voltage applied to the field electrode 4 relative to the semiconductor body portion 17, the surface channel constituted by the body portion 17 is either closed or opened in the manner explained above. As a result, the second capacitance constituted by the second p-n junction 20 at the zone 1 of p conductivity type is either connected in parallel relation to the first mentioned capacitance of junction 19 or is disconnected therefrom.

By providing additional zones of the opposite conductivity type, and consequently additional p-n junctions, all arranged beside each other within the semiconductor crystal, and by also adding corresponding field electrodes, the above-described effect can be multiplied at will so that any desired range of capacitance variation can be covered. The device partially illustrated in FIG. 1 and thus affording a widened rise in capacitance, can be employed, for example, as part of an integrated circuit.

The coaxial capacitor device shown in FIG. 2 comprises a circular body of silicon of n conductivity type comprising two regions 15 and 16 of respectively different specific electrical resistance. Located within the region 15 of the higher specific resistance are zones 13 and 14 of p conductivity type. These zones form a coaxial arrangement, the zone 13 having the shape of a circular ring surrounding the centrally located and likewise circular zone 14. The device is readily producible by the planar technique and accordingly possesses a coating 9 of silicon dioxide which extends also between the semiconductor body 18 and the field electrode 10, the latter having the shape of a circular ring which completely covers the ring-shaped semiconductor portion 18 between the inner zone 14 of p conductivity type and the outer zone 13 of p conductivity type. The coating 9 is provided with an opening located in the center and above the central zone 14, and the zone 14 is contacted by a metal electrode 11 within the opening.

The electrode 11 and an electrode 12 at the opposite side of the semiconductor body constitute the main electrodes of the capacitor. When applying a corresponding voltage between these electrodes and consequently between the zone 14 of p conductivity type and the main portion of the semiconductor body, the device functions as a capacitor whose capacitance is determined substantially by that of the p-n junction 22 and consequently by the voltage-responsive widening or narrowing of the space-charge zone at the junction 22. By applying a suitable bias voltage to the field electrode 10, the conductivity of the channel portion 18 can be modified, thus opening or closing the connecting channel. The widening of the capacitances rise in this device, therefore, is effected by a controlled parallel connection of the ring-shaped p-n junction 21 with the main junction 22.

While the coaxial device in FIG. 2 constitutes a complete capacitor, the same coaxial arrangement is also applicable as a component of an integrated circuit, in which case the electrode 12 may be omitted if a corresponding connection is to be made at a different location of the semiconductor body.

A particular advantage of controlling the connecting channels between the main capacitance and the additionally available capacitances with the aid of a field electrode resides in the fact that the intermediate insulating layer provides for complete galvanic isolation between the field-electrode circuit, on the one hand, and the circuit containing the voltage-dependent capacitances, on the other hand.

While in the foregoing description of the illustrated embodiments reference is made to silicon, it will be understood that germanium and semiconductor compounds are applicable in the same manner. To those skilled in the art it will further be obvious from the foregoing disclosure that various other modifications, such as changes with respect to configuration, dimensions and number of components, are readily applicable and hence that the invention may be given embodiments other than particularly illustrated and described herein, without departing from the essential features of the invention and within the scope of the claims annexed hereto.

I claim:

1. A voltage-responsively variable p-n junction capacitor, comprising a semiconductor body of one conductivity type having at least two zones of the other conductivity type mutually spaced beside one another and each forming a respective p-n junction, one of said zones constituting one electrode and said body the other electrode of a voltage-dependent capacitor including one of the p-n junctions, an intermediate body portion interconnecting said zones and including voltage-responsive control means for controlling the electrical conductivity thereof to selectively electrically connect the other zone to said one zone and in parallel therewith in said p-n junction capacitor in response to selective voltage applied across said control means and said body, whereby the capacitance variation range of the capacitor is selectively widenable in response to said control means.

2. A variable p-n junction capacitor as claimed in claim 1, wherein said electrodes impress voltage across said one p-n junction, and said control means comprises a third electrode at said intermediate portion of said body for causing the capacitances of said p-n junctions to be parallel connected by increasing the conductivity of said intermediate portion.

3. A variable p-n junction capacitor as claimed in claim 1, wherein said control means comprises means for producing an electric field in said intermediate portion to thereby increase the conductivity of said portion.

4. A variable p-n junction capacitor as claimed in claim 3, wherein said electric field means comprises an insulating coating on the surface of said intermediate portion of said body and a field electrode formed of a metal layer on said coating.

5. A variable p-n junction capacitor as claimed in claim 4, wherein said insulating coating is formed of an oxide layer.

6. A variable p-n junction capacitor as claimed in claim 4, wherein said insulating coating is formed of silicon dioxide.

7. A variable p-n junction capacitor as claimed in claim 1, wherein said semiconductor body forms a planar wafer, said zones of said other conductivity type being diffusion-doped at one flat side of said wafer and having an oxide coating with an opening above one of said zones, one of said electrodes being conductively joined with said one zone in said opening.

8. A variable p-n junction capacitor as claimed in claim 1, wherein said semiconductor body has a region of relatively low specific electric resistance and an adjacent region of relatively high specific electric resistance, said zones of said other conductivity type being located in said region of said high resistance.

9. A variable p-n junction capacitor as claimed in claim 1, wherein said zones of the other conductivity type are arranged in coaxial relation to each other.

References Cited

UNITED STATES PATENTS

| | | | |
|---|---|---|---|
| 2,989,650 | 6/1961 | Doucette et al. | 317—234 |
| 2,993,155 | 7/1961 | Gotzberger | 317—234 |
| 3,246,173 | 4/1966 | Silver | 317—234 |
| 3,309,586 | 3/1967 | Kleinknecht | 317—234 |

JAMES D. KALLAM, *Primary Examiner.*